(12) United States Patent
Fan et al.

(10) Patent No.: US 11,404,844 B2
(45) Date of Patent: Aug. 2, 2022

(54) SEMICONDUCTOR STRUCTURE AND METHOD OF MANUFACTURING THE SAME

(71) Applicant: OMNIVISION TECHNOLOGIES, INC., Santa Clara, CA (US)

(72) Inventors: Chun-Sheng Fan, Zhudong Township (TW); Wei-Feng Lin, Hsinchu County (TW)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 679 days.

(21) Appl. No.: 16/440,031

(22) Filed: Jun. 13, 2019

(65) Prior Publication Data

US 2020/0395730 A1  Dec. 17, 2020

(51) Int. Cl.

| *H01S 5/02255* | (2021.01) |
| *H01S 5/02208* | (2021.01) |
| *H01S 5/00* | (2006.01) |
| *H01S 5/02253* | (2021.01) |
| *H01S 5/02325* | (2021.01) |

(52) U.S. Cl.
CPC ........ *H01S 5/02255* (2021.01); *H01S 5/0092* (2013.01); *H01S 5/02208* (2013.01); *H01S 5/02253* (2021.01); *H01S 5/02325* (2021.01)

(58) Field of Classification Search
CPC ............. H01S 5/02255; H01S 5/02325; H01S 5/02253; H01S 5/0092; H01S 5/02208
USPC ....................................................... 359/566
See application file for complete search history.

(56) References Cited

U.S. PATENT DOCUMENTS

| 2003/0071313 A1* | 4/2003 | Ishibashi ............... H01L 27/092 438/223 |
| 2014/0027709 A1* | 1/2014 | Higginson .............. H01L 33/42 438/26 |
| 2014/0029894 A1* | 1/2014 | Bowen ..................... G02B 6/34 385/37 |
| 2016/0148973 A1* | 5/2016 | Saito ..................... H01L 33/002 257/90 |
| 2016/0178915 A1* | 6/2016 | Mor ................... G02B 27/4205 359/566 |
| 2017/0199144 A1 | 7/2017 | Noble et al. |
| 2019/0131771 A1 | 5/2019 | Wan et al. |
| 2019/0310541 A1* | 10/2019 | Zhang ................ G02B 27/0006 |

* cited by examiner

*Primary Examiner* — Dalzid E Singh
(74) *Attorney, Agent, or Firm* — Muncy, Geissler, Olds & Lowe, P.C.

(57) ABSTRACT

A semiconductor structure is provided. The semiconductor structure includes: a substrate having a cavity recessed from a top surface of the substrate toward a bottom surface of the substrate opposite to the top surface, wherein the cavity has a sidewall and a bottom surface, and the bottom surface of the cavity is substantially parallel to the top surface of the substrate; a light source structure in the cavity, and the light source structure emitting a light from a sidewall of the light source structure; and a diffractive optical element (DOE) over the top surface of the substrate; wherein the sidewall of the cavity is a sloped surface, so that when the light is incident on the sidewall, the sloped surface reflects the incident light to generate a reflected light toward the DOE. Associated semiconductor structure and manufacturing method are also disclosed.

20 Claims, 15 Drawing Sheets

SEMICONDUCTOR STRUCTURE AND METHOD OF MANUFACTURING THE SAME

BACKGROUND

1. Technical Field

The present invention relates generally to a semiconductor structure, and particularly to an optical pattern projector.

2. Description of the Related Art

Optical modules are very commonly used in consumer electronic devices. For example, almost all current portable telephones and computers include a miniature camera module. Miniature optical projection modules are also expected to come into increasing use in portable consumer devices for a variety of purposes.

Such projection modules may be used, for example, to cast a pattern of structured light onto an object for purposes of 3D mapping (also known as depth mapping). Known projection modules include a light source, such as a laser diode or LED, to emit light through diffractive optical elements (DOEs), so as to project a pattern onto the object. An image capture assembly captures an image of the pattern that is projected onto the object, and a processor processes the image so as to reconstruct a three-dimensional (3D) map of the object. In order to further reduce those consumer electronic devices, size and integration issues of the projection modules still need to be improved.

SUMMARY

In accordance with an aspect of the present disclosure, a semiconductor structure is disclosed. The semiconductor structure includes: a substrate having a cavity recessed from a top surface of the substrate toward a bottom surface of the substrate opposite to the top surface, wherein the cavity has a sidewall and a bottom surface, and the bottom surface of the cavity is substantially parallel to the top surface of the substrate; a light source structure in the cavity, and the light source structure emitting a light from a sidewall of the light source structure; and a diffractive optical element (DOE) over the top surface of the substrate; wherein the sidewall of the cavity is a sloped surface, so that when the light is incident on the sidewall, the sloped surface reflects the incident light to generate a reflected light toward the DOE.

In accordance with another aspect of the present disclosure, a semiconductor structure is disclosed. The semiconductor structure includes: a substrate having a cavity recessed from a top surface of the substrate toward a bottom surface of the substrate opposite to the top surface, wherein the cavity has a sidewall and a bottom surface, and the bottom surface of the cavity is substantially parallel to the top surface of the substrate; a light source structure in the cavity; a first transparent substrate over the top surface of the substrate; a conductive layer between the substrate and the first transparent substrate; and a first conductive feature passing through the first transparent substrate, the substrate and the conductive layer, and the first conductive feature being coupled to the light source structure through the conductive layer.

In accordance with still another aspect of the present disclosure, method of manufacturing a semiconductor structure is disclosed. The method includes: providing a substrate having a top surface and a bottom surface opposite to the top surface; etching the substrate to obtain a cavity at the top surface of the substrate, wherein the cavity has a sidewall and a bottom surface, and the bottom surface of the cavity is substantially parallel to the top surface of the substrate; forming a first through hole passing through the substrate; depositing a conductive layer over the top surface of the substrate and the sidewall and the bottom surface of the cavity; bonding a light source structure in the cavity, and the light source structure emitting a light from a sidewall of the light source structure; and disposing a transparent substrate over the substrate, wherein the transparent substrate includes a diffractive optical element (DOE) on a top surface of the transparent substrate; forming a second through hole passing through the transparent substrate, wherein the second through hole aligns the first through hole; and injecting conductive material into the second through hole, wherein the conductive material flows into the first through hole from the second through hole.

Figure 1:
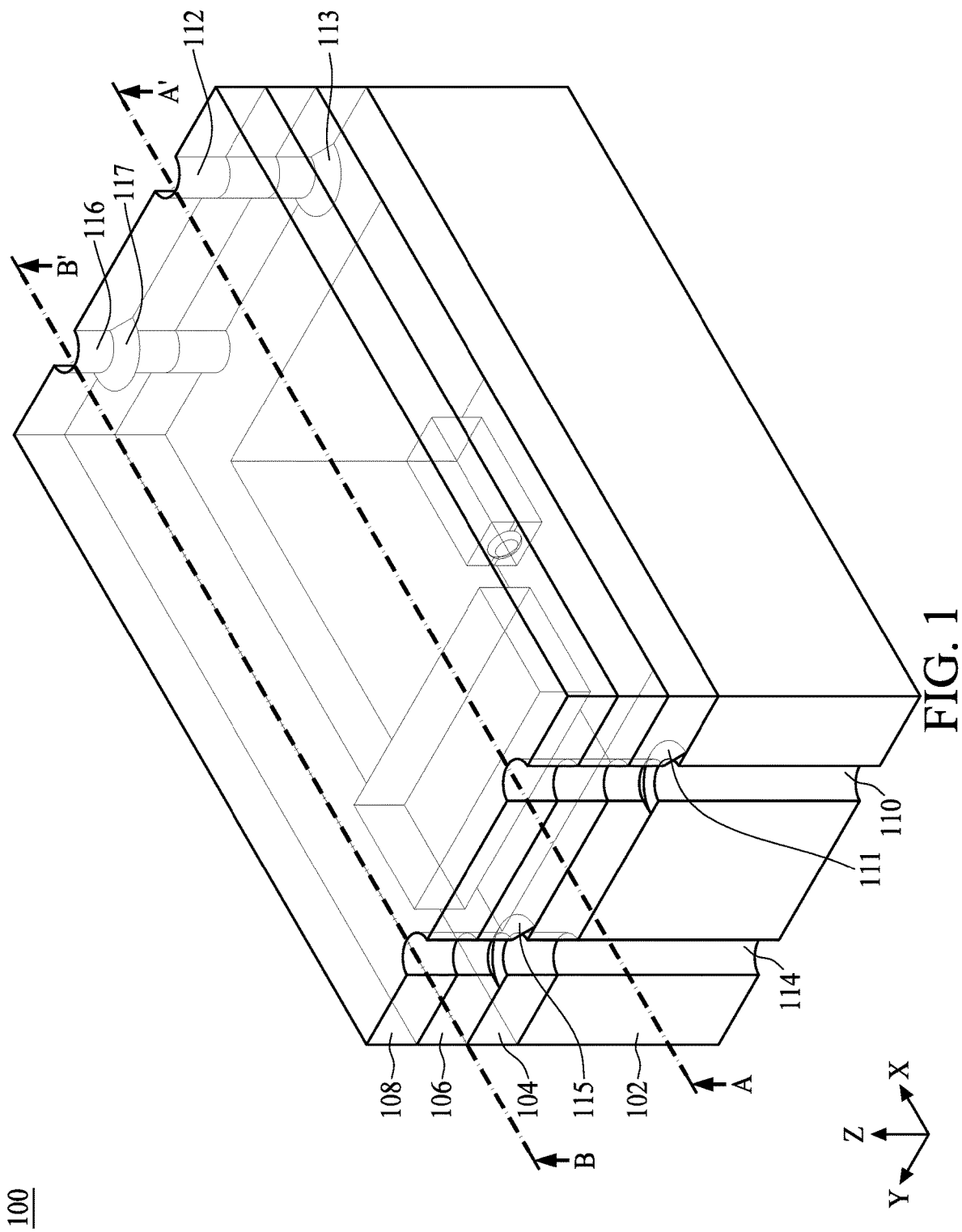
FIG. 1 is a diagram illustrating a semiconductor structure in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides many different embodiments or examples for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or the configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" can mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a semiconductor structure 100 in accordance with some embodiments of the present disclosure. The semiconductor structure 100 may be an optical pattern projector for casting a pattern of structured light onto an object for purposes of 3D mapping (also known as depth mapping). However, this is not a limitation of the present disclosure. In some embodiments, the semiconductor structure 100 may be an optical projector for other usage. The terms "optical" and "light" as used in the present description and in the claims refer generally to any and all of visible, infrared, and ultraviolet radiation.

The semiconductor structure 100 includes a semiconductor substrate 102 with a first transparent substrate 104, a spacer 106 and second transparent substrate 108 stacked thereover in order along an z-axis. The semiconductor substrate 102 may be a bulk silicon substrate. Alternatively, the semiconductor substrate 102 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible semiconductor substrate 102 also includes a silicon-on-insulator (SOI) substrate. SOI substrates are fabricated using separation by implantation of oxygen (SIMOX), wafer bonding, and/or other suitable methods.

The first transparent substrate 104 may include, such as glass or a suitable plastic, for example polycarbonate, with a first diffractive optical element (DOE) 132 (shown in FIG. 2) formed on one of its optical surfaces away from the semiconductor substrate 102. The first DOE 132 may be an uneven structure that induces optical diffraction. For example, the first DOE 132 may include a grating structure. In some embodiments, the uneven structure region and the entire first transparent substrate 104 may be overall regarded as the first DOE 132. In some embodiments, the first DOE 132 may be referred to the uneven structure, i.e. a portion of the first transparent substrate 104. The latter representation is used in the present description and in the claims. The second transparent substrate 108 may include a second DOE 138 formed on one of its optical surfaces facing the semiconductor substrate 102. The second DOE 138 may include a structure similar or corresponding to the first DOE 132. In some embodiments, suitable AR coatings and/or mechanical protection embedding layers (not shown) may be stacked over a top surface of the second transparent substrate 108.

The first transparent substrate 104 and the second transparent substrate 108 are separated by the spacer 106. In some embodiments, the spacer 106 is manufactured of conductive material and is connected to ground potential for providing additional shielding. In some embodiments, the spacer 106 is manufactured of an insulating material, such as a polymer or a glassy ceramic composition (for example, a frit), the latter being used to create a hermetic seal for the space between the first transparent substrate 104 and the second transparent substrate 108.

The semiconductor structure 100 further includes a first conductive feature 110, a second conductive feature 112, a third conductive feature 114 and a fourth conductive feature 116. The first conductive feature 110 and the third conductive feature 114 are at a first sidewall of the semiconductor structure 100; and the second conductive feature 112 and the fourth conductive feature 116 are at a second sidewall of the semiconductor structure 100 opposite to the first sidewall. Each of the first conductive feature 110, the second conductive feature 112, the third conductive feature 114 and the fourth conductive feature 116 may be a conductive layer such as silver layer covering a recessed structure at the first/second sidewall of the semiconductor structure 100. Please note that the first conductive feature 110, the second conductive feature 112, the third conductive feature 114 and the fourth conductive feature 116 which fill up the recessed structures are also within the contemplated scope of the present disclosure.

The recessed structure extends along the z-axis. From another point of view, the recessed structure from top to bottom passing through the second transparent substrate 108, the spacer 106, the first transparent substrate 104 and the semiconductor substrate 102. In particular, the recessed structure may have a semicircular shape from a top view. The first conductive feature 110, the second conductive feature 112, the third conductive feature 114 and the fourth conductive feature 116 have conductor structures 111, 113, 115 and 117 respectively. The semiconductor structure 100 complies with existing wafer level process. With the design of the first conductive feature 110, the second conductive feature 112, the third conductive feature 114 and the fourth conductive feature 116, the semiconductor structure 100 forms a compact package which can communicate with external circuits. Further details will be described in the following paragraphs.

Figure 2:
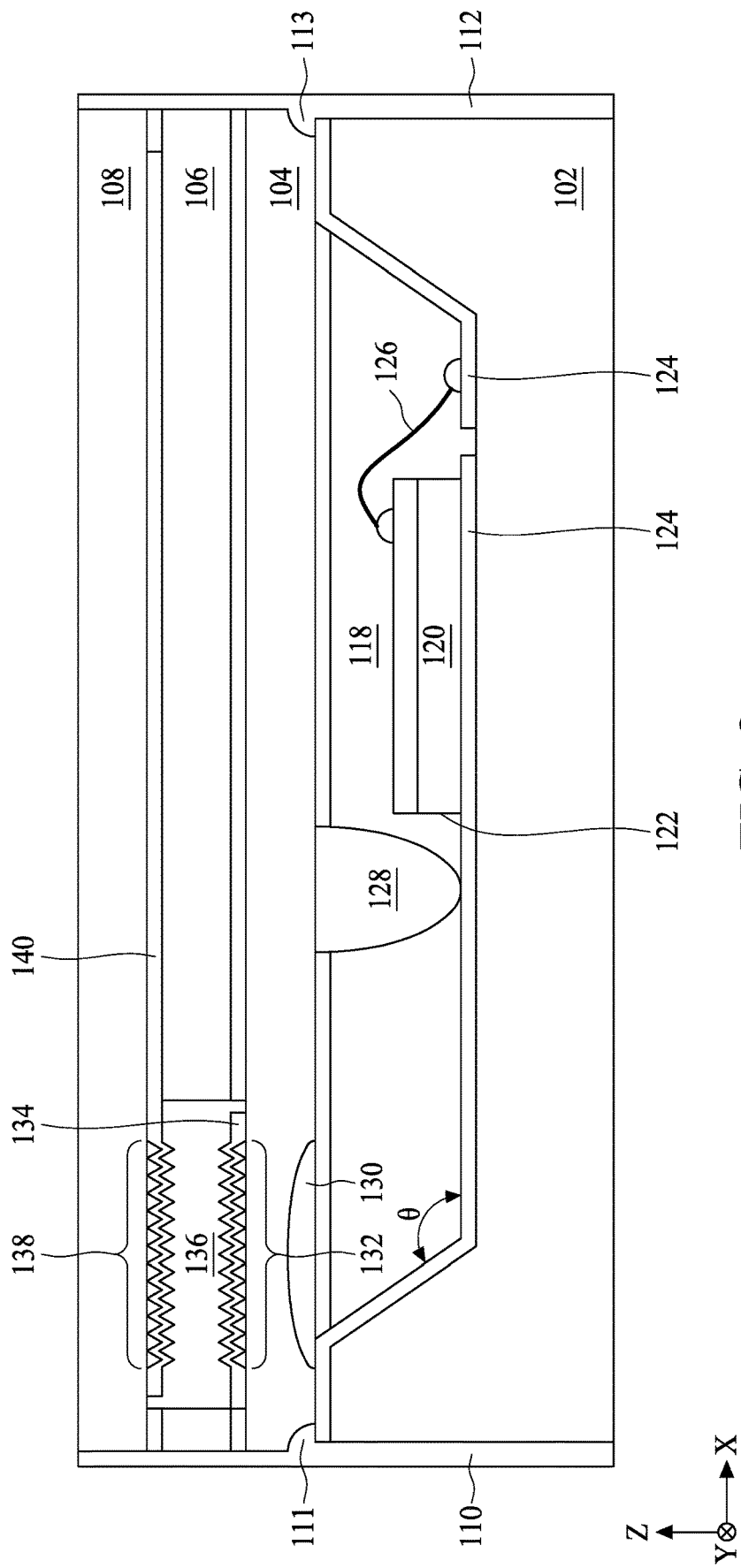
FIG. 2 is a cross-sectional view of the semiconductor structure taken along line A-A' of FIG. 1.
Figure 3:
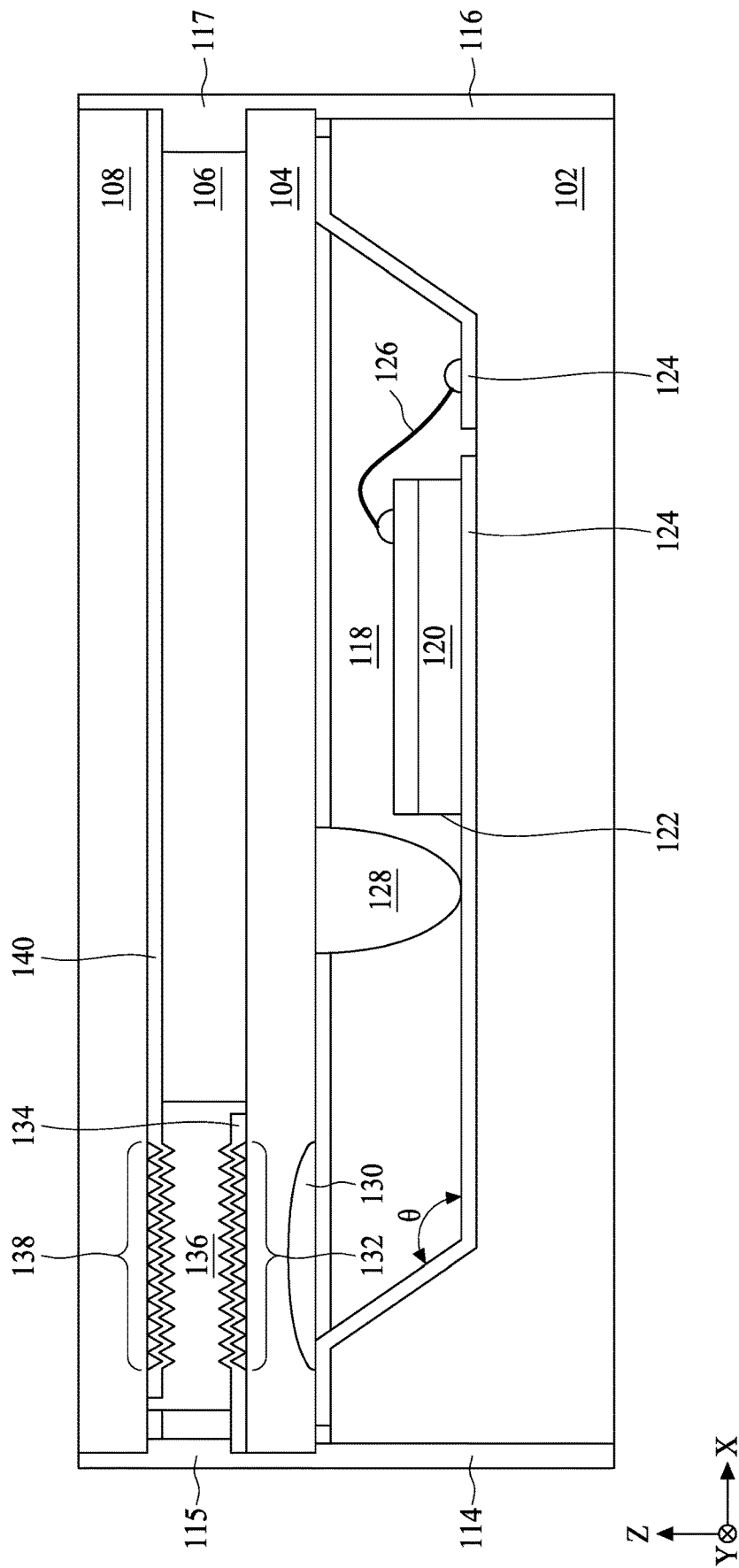
FIG. 3 is a cross-sectional view of the semiconductor structure taken along line B-B' of FIG. 1.

FIG. 2 is a cross-sectional view of the semiconductor structure 100 taken along line A-A' of FIG. 1. FIG. 3 is a cross-sectional view of the semiconductor structure 100 taken along line B-B' of FIG. 1. The line A-A' of FIG. 1 passes through the first conductive feature 110 and the second conductive feature 112. The line B-B' of FIG. 1 passes through the third conductive feature 114 and the fourth conductive feature 116. The cross-sectional views show more details inside the semiconductor structure 100. As shown in FIG. 2 and FIG. 3, the semiconductor substrate 102 includes a cavity 118 recessed from a top surface of the semiconductor substrate 102 toward a bottom surface of the semiconductor substrate 102 opposite to the top surface. The cavity 118 has a sidewall and a bottom surface, and the bottom surface of the cavity 118 is substantially parallel to the top surface of the semiconductor substrate 102. The sidewall of the cavity 118 is a sloped surface, i.e. the bottom surface and the sidewall of the cavity 118 are non-orthogonal to each other. For example, an angle θ between the bottom surface and the left sidewall of the cavity 118 is greater than about 90 degree. In some embodiments, the sidewall of the cavity 118 has a (111) surface orientation. The bottom surface of the cavity 118 has a (100) surface orientation substantially the same as the top surface of the semiconductor substrate 102. In this case, the angle θ is about 54.7 degrees. In some embodiments, the cavity 118 has a trapezoidal cross-section.

The semiconductor structure 100 further includes a light source structure 120 in the cavity 118, and the light source structure 120 emits a light from a side 122 of the light source structure 120 instead of a top surface of the light source structure 120. In particular, the light source structure 120 is disposed at the bottom surface of the cavity 118. A top surface of the light source structure 120 is not higher than the top surface of the substrate. In this way, the upper stacked first transparent substrate 104 and the semiconductor substrate 102 can form a sealed space, i.e. the cavity 118. In some embodiments, the light source structure 120 is an edge emitting laser diode (EELD) emitting light from the left side 122 of the light source structure 120.

Please note that there is further a conductive layer 124 between the semiconductor substrate 102 and the first transparent substrate 104. The conductive layer 124 may include metal such as aluminum or copper. In particular, the conductive layer 124 extends along the top surface of the semiconductor substrate 102, the sidewall and the bottom surface of the cavity 118. The conductive layer 124 may extends between the light source structure 120 and the bottom surface of the cavity 118, so that the conductive layer 124 can be electrically coupled to a first power pad, i.e. a first terminal, at a bottom surface of the light source structure 120. A second power pad, i.e. a second terminal, at the top surface of the light source structure 120 may be coupled to the conductive layer 124 through a conductor 126, such as a conductive wire including metal. As can be seen from the cross-sectional view of FIG. 2 taken along the line A-A', the conductive layer 124 is coupled to the first conductive feature 110 and the second conductive feature 112 through the conductor structures 111 and 113 respectively in order to provide power to the light source structure 120. The cross-sectional view of FIG. 3 does not show such a configuration since the third conductive feature 114 and the fourth conductive feature 116 does not coupled to the light source structure 120. The third conductive feature 114 and the fourth conductive feature 116 is used to couple the semiconductor structure 100 to a capacitance measurement circuit (not shown) outside the semiconductor structure 100, and will be described in more detail later.

The light from the light source structure 120 passes through a lens 128 between the light source structure 120 and the left sidewall of the cavity 118 for light diameter expanding. Then the light incidents on the left sidewall of the cavity 118. The sloped surface of the left sidewall of the cavity 118 reflects the incident light to generate a reflected light toward the first DOE 132 over the semiconductor substrate 102 according to the angle θ. The (111) surface orientation having small surface roughness and the conductive layer 124 both provide good reflection characteristic.

The horizontal light path from the side 122 of the light source structure 120 passing through the lens 128 helps to reduce a total vertical thickness (along the z-axis) of the semiconductor structure 100, while remaining the same extent of light diameter expanding compared to the existing vertical-cavity surface-emitting laser (VCSEL) plus DOE structure. In other words, the present disclosure replaces the all vertical light path of the existing VCSEL plus DOE structure with the partial horizontal and partial vertical light path structure and gains benefit, i.e. the reduced thickness, from it.

The lens 128 may include organic polymer material such as glass or plastic. As shown in FIG. 2 and FIG. 3, the lens 128 may be integrally formed at a bottom surface of the first transparent substrate 104. In particular, the lens 128 extrudes from the bottom surface of the first transparent substrate 104 toward a direction away from the first transparent substrate 104.

Back to the reflected light path, the first transparent substrate 104 includes an optical structure 130 integrally formed at its bottom surface for light diameter expanding. For example, the optical structure 130 may be a concave structure as shown in FIG. 2 and FIG. 3. However, this is not a limitation of the present disclosure. In some embodiments, the optical structure 130 may be a convex structure. The reflected light reflected from the sloped surface of the left sidewall of the cavity 118 passes through the optical structure 130 and further expanded before arriving at the first DOE 132 and then the second DOE 138.

A first electrical thin film 134 may be formed over the first DOE 132. The first electrical thin film 134 may include indium tin oxide (ITO) to form a first capacitance electrode extends over the first DOE 132 and its close surroundings. Similarly, the second electrical thin film 140 may form a second capacitance electrode extends over the second DOE 138 and its close surroundings. The first electrical thin film 134 and the second electrical thin film 140 provide a function of monitoring the performance of the first DOE 132 and the second DOE 138 respectively, by coupling the capacitance measurement circuit to the first electrical thin film 134 and the second electrical thin film 140. In particular, the first electrical thin film 134 and the second electrical thin film 140 are coupled to the third conductive feature 114 and the fourth conductive feature 116 through the conductor structures 115 and 117 respectively, and the third conductive feature 114 and the fourth conductive feature 116 are coupled to the capacitance measurement circuit. Therefore the capacitance measurement circuit can be coupled to the first electrical thin film 134 and the second electrical thin film 140 as can be seen from the cross-sectional view of FIG. 3 taken along the line B-B'.

FIG. 4 to FIG. 12 are cross-sectional views illustrating a method for manufacturing the semiconductor structure 100 in accordance with some embodiments of the present disclosure. In the cross-sectional views, two semiconductor structures 100A and 100B are shown in order to particularly convey the idea that a plurality of semiconductor structures 100 are manufactured at the same time on the same semiconductor substrate 102 before a cutting process. In some of the following descriptions, it is focused on the semiconductor structures 100A and duplicated descriptions regarding the semiconductor structures 100B may be omitted for conciseness. Please note that the conductor structures 111, 113, 115 and 117 and associated connections are depicted in the same cross-sectional view in order to facilitate explanation. That is, the cross-sectional views taken along the line A-A' and the line B-B' are combined together in FIG. 4 to FIG. 12.

Figure 4:
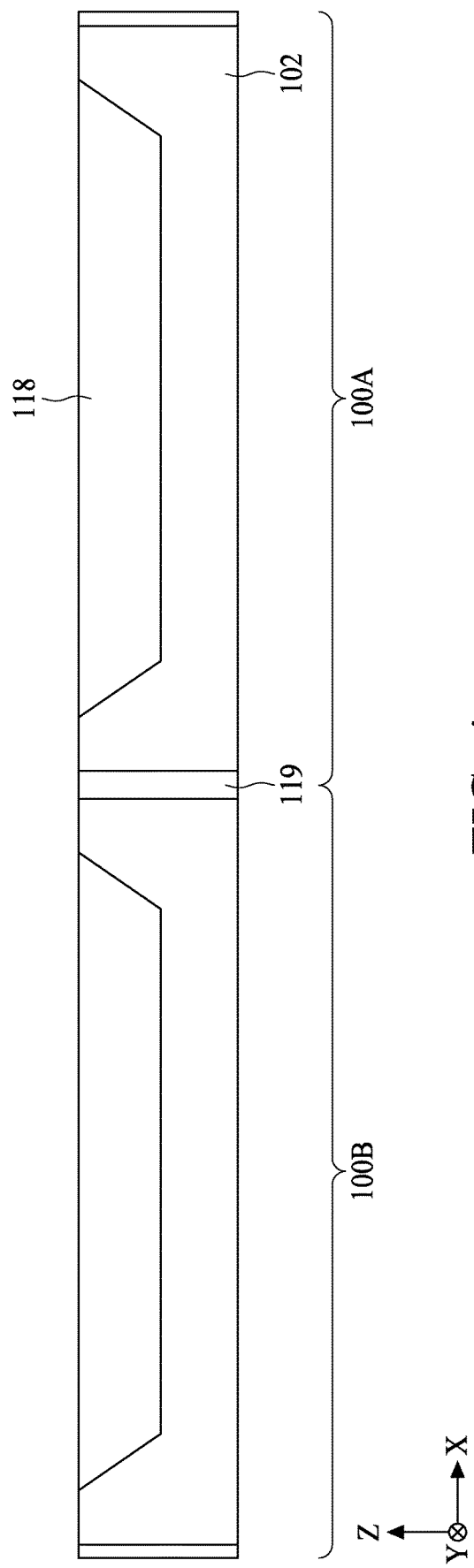
FIG. 4 to FIG. 12 are cross-sectional views illustrating a method for manufacturing the semiconductor structure in accordance with some embodiments of the present disclosure.

In FIG. 4, the semiconductor substrate 102 is provided. The cavities 118 are formed by any suitable operation including various photolithographies and/or etching operations. In an example, the cavities 118 are formed by patterning and etching a portion of the semiconductor substrate 102 from the top surface. In particular, an anisotropic wet etch process may be employed to create the cavities 118. A laser drilling process is further used to form through holes 119 between the neighboring semiconductor structures 100, for example, the through hole 119 between the semiconductor structure 100A and the semiconductor structure 100B.

Figure 5:
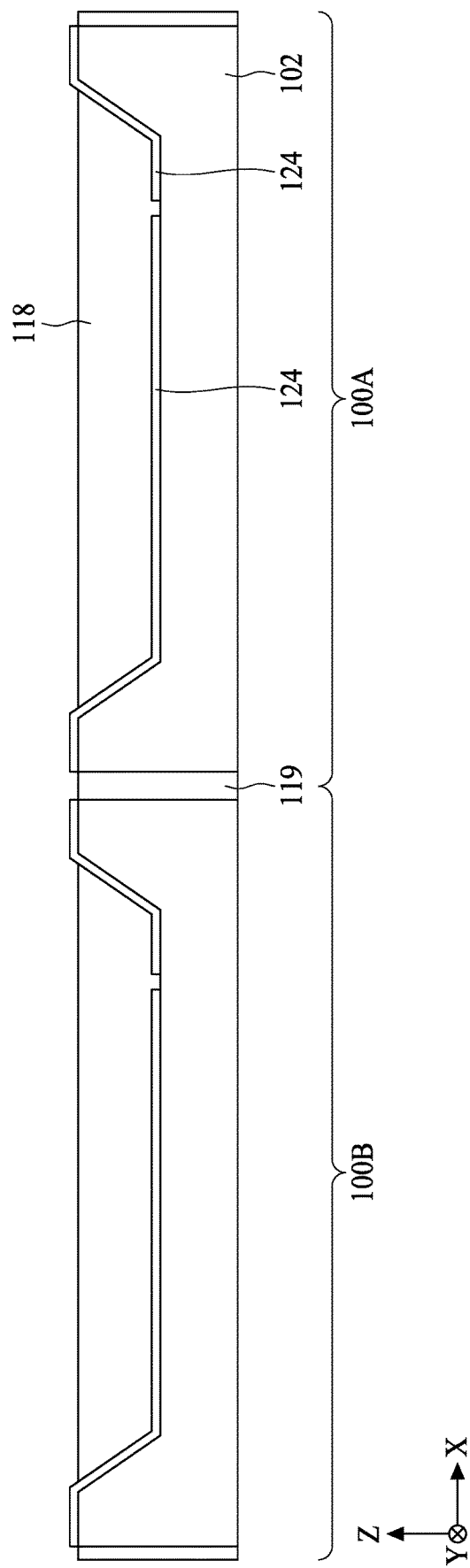
Figure 6:
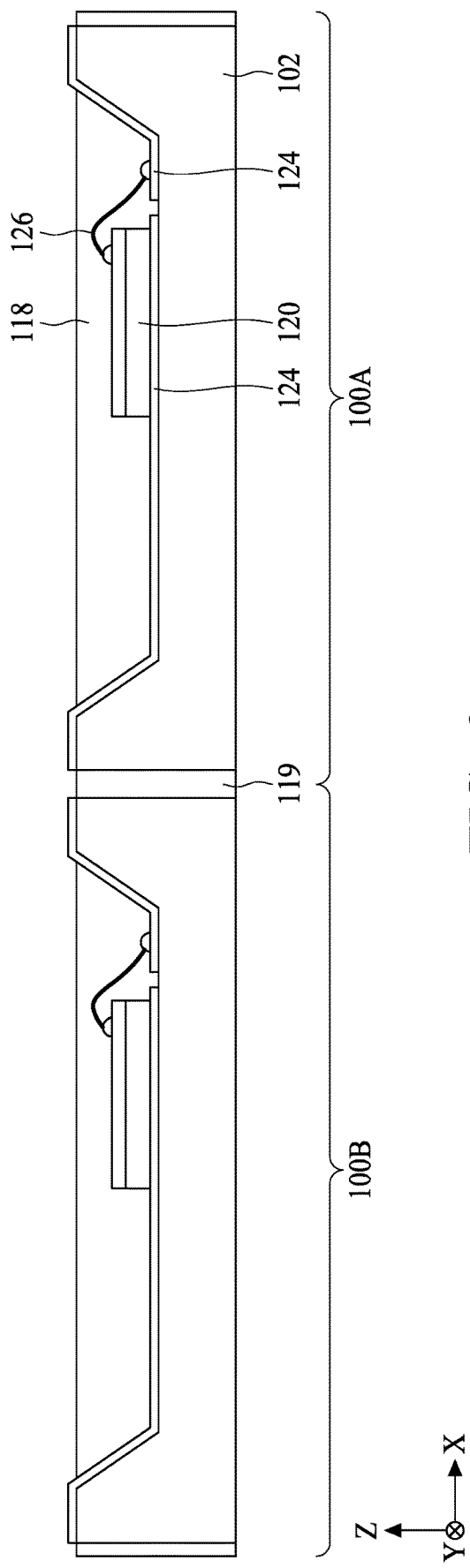

In FIG. 5, the conductive layers 124 are formed over the semiconductor structures 100A and 100B by any suitable operation including various deposition and pattern operations. Then the light source structure 120 is disposed in each cavity 118 and bonded to the conductive layer 124 as shown in FIG. 6. The conductor 126 is further provided to electrically couple the light source structures 120 with the conductive layers 124.

Figure 7:
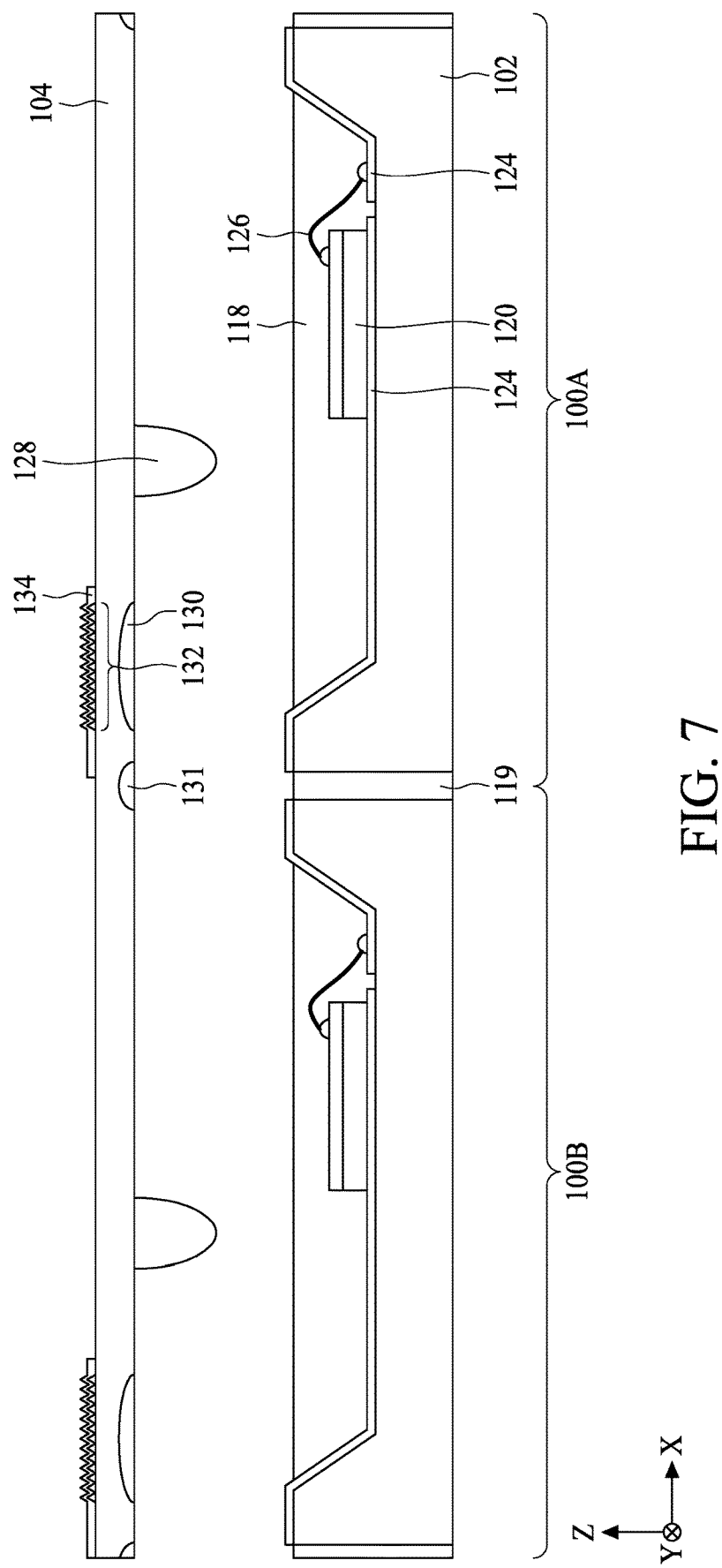

In FIG. 7, the first transparent substrate 104 is provided. The first transparent substrate 104 has the lenses 128, the optical structures 130, recess structures 131, the first DOEs 132 and the first electrical thin films 134 formed thereon. The lenses 128, the optical structures 130 and the recess structures 131 may be integrally formed at the bottom surface of the first transparent substrate 104 by any suitable operation including various photoresist processes. The bottom surface faces the semiconductor substrate 102. The first DOEs 132 may be integrally formed at the top surface of the first transparent substrate 104 opposite to the bottom surface. For example, the first DOEs 132 may be etched or embossed into the first transparent substrate 104. The first electrical thin films 134 are coated and patterned over the first DOEs 132. The recess structures 131 are preserved for the conductor structures 111 and 113 which couple to the conductive layers 124. As such, a width of the recess structures 131 should laterally extend to overlap the conductive layers 124 from a top view.

Figure 8:
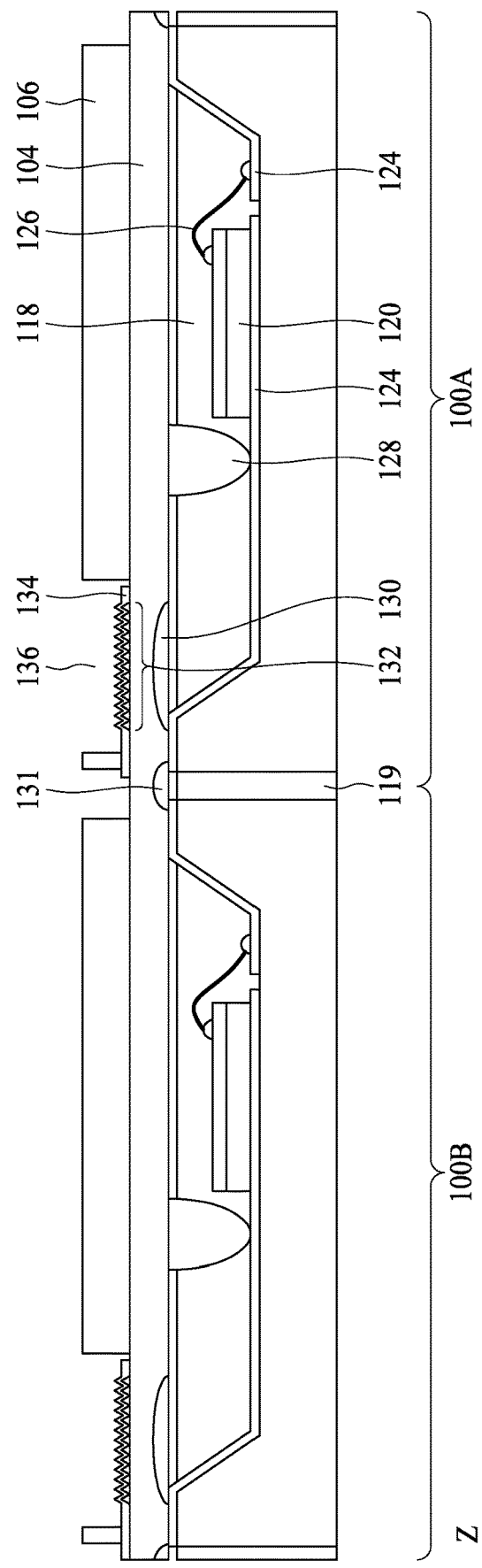

The first transparent substrate 104 is then attached to the semiconductor substrate 102 as shown in FIG. 8. The spacer 106 is disposed between the first transparent substrate 104 and the later attached second transparent substrate 108 for a hermetic seal for the space 136 between the first DOEs 132 and the second DOEs 138. For example, the spacer 106 may be coated and patterned through any suitable operation including various photolithographies. Please note that recess structures 137 are preserved for the conductor structures 115 and 117 which couple to the first electrical thin films 134 and the second electrical thin films 140 respectively. As such, a width of the recess structures 137 should laterally extend to overlap the first electrical thin films 134 and the second electrical thin films 140 from a top view.

Figure 9:
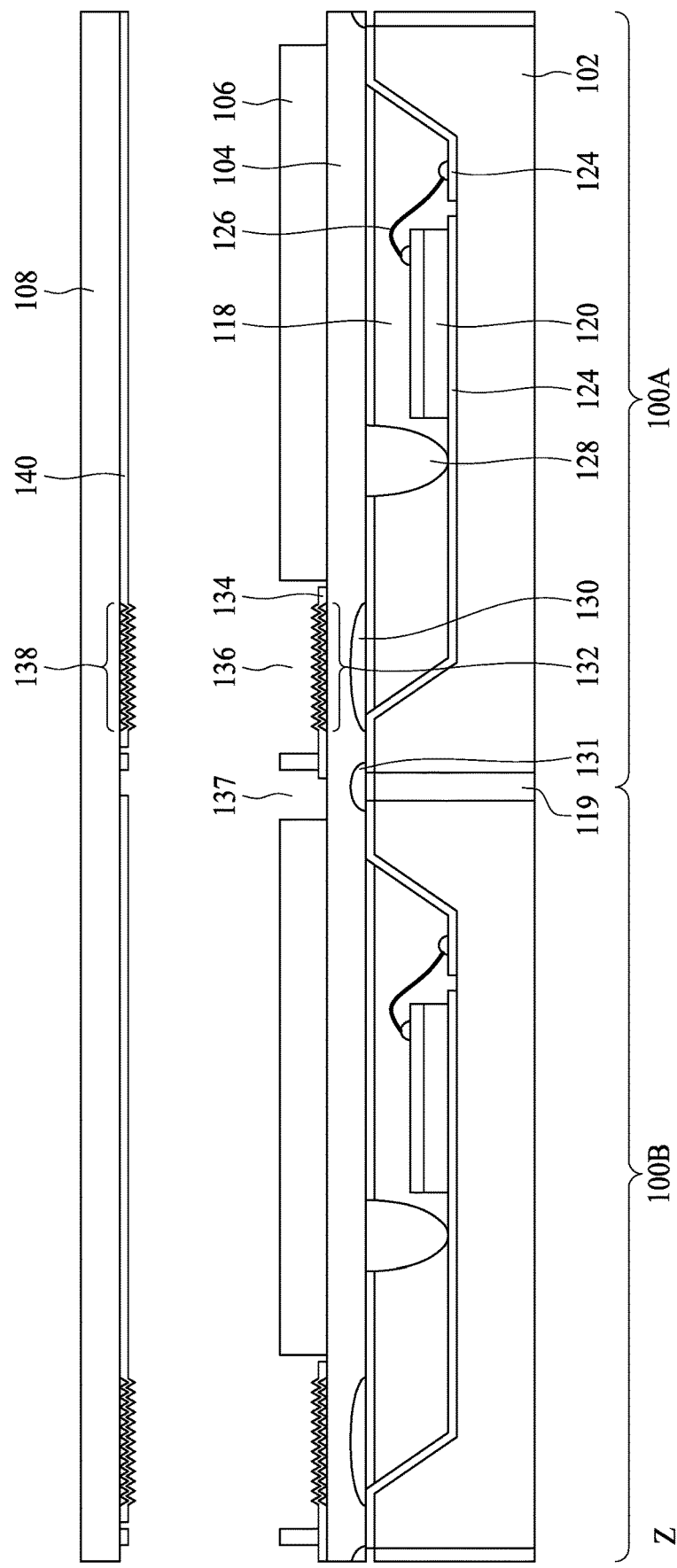
Figure 10:
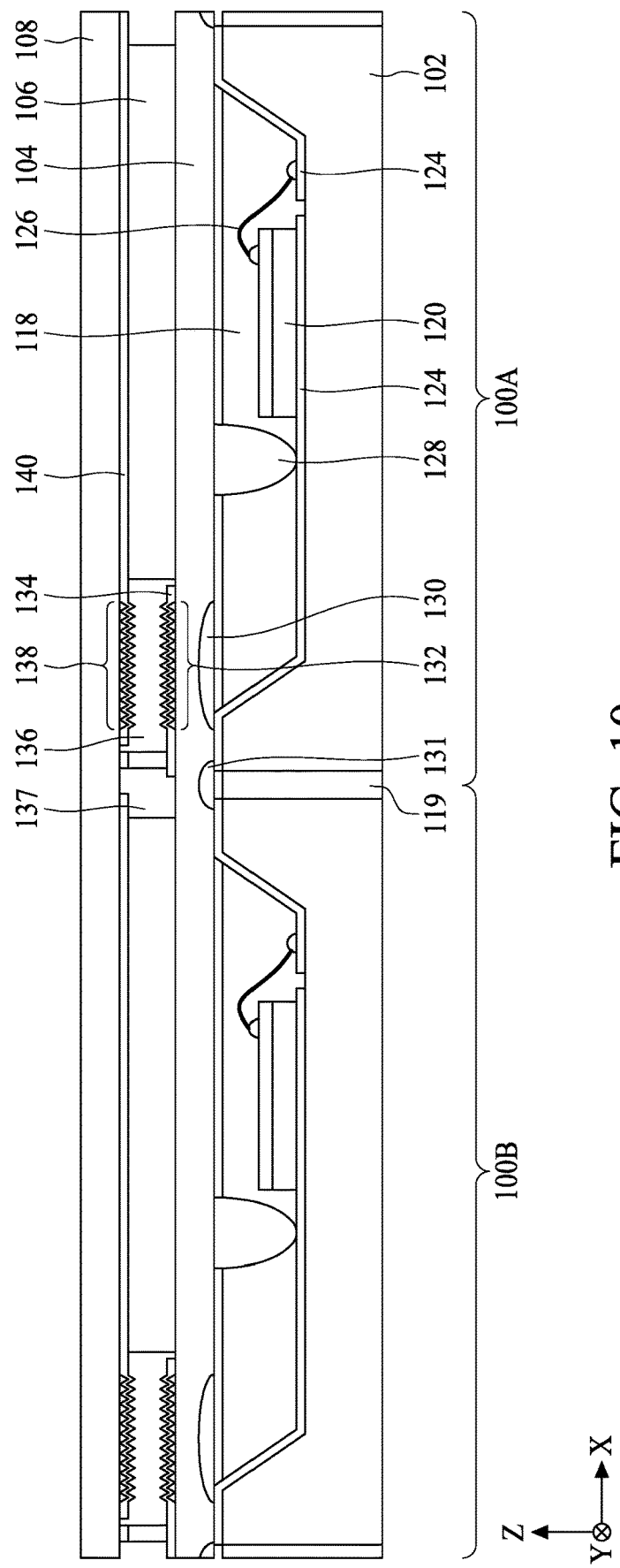

In FIG. 9, the second transparent substrate 108 is provided. The second transparent substrate 108 has the second DOEs 138 and the second electrical thin films 140 formed thereon. The second DOEs 138 may be integrally formed at the bottom surface of the second transparent substrate 108 facing the semiconductor substrate 102. For example, the second DOEs 138 may be etched or embossed into the second transparent substrate 108. The second electrical thin films 140 are coated and patterned over the second DOEs 138. In some embodiments, suitable AR coatings and/or mechanical protection embedding layers may be deposited over the top surface of the second transparent substrate 108. The second transparent substrate 108 is attached to the spacers 106 as shown in FIG. 10.

Figure 11:
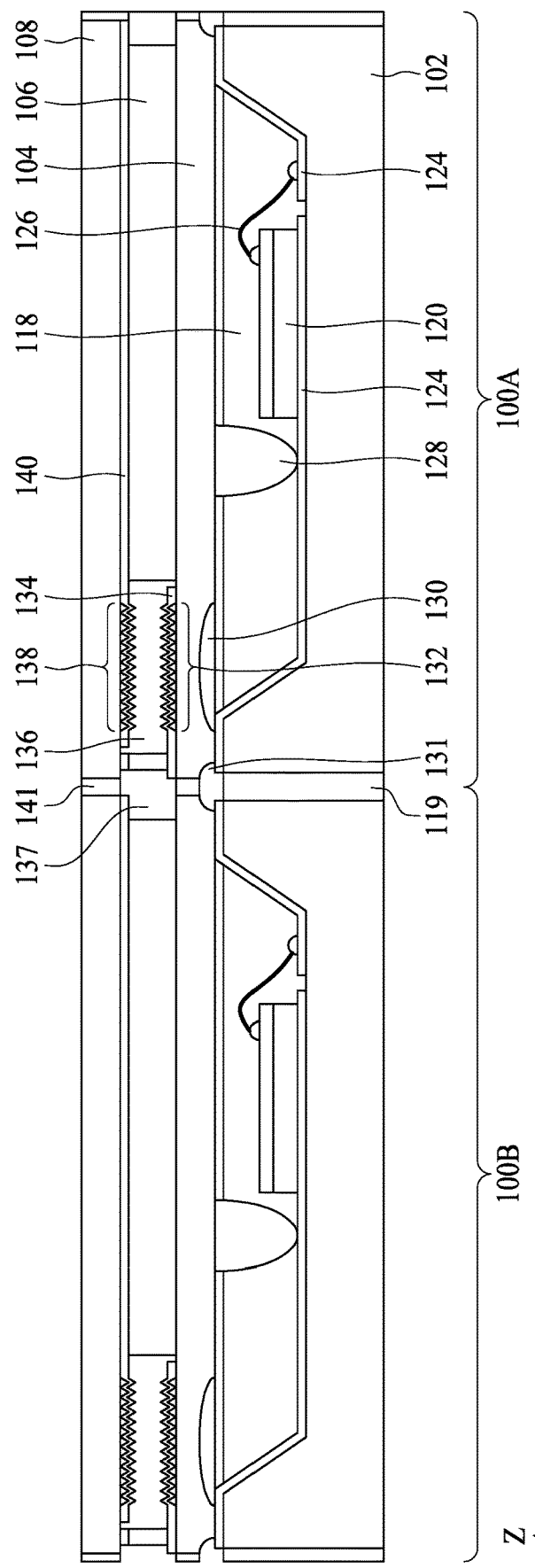
Figure 12:
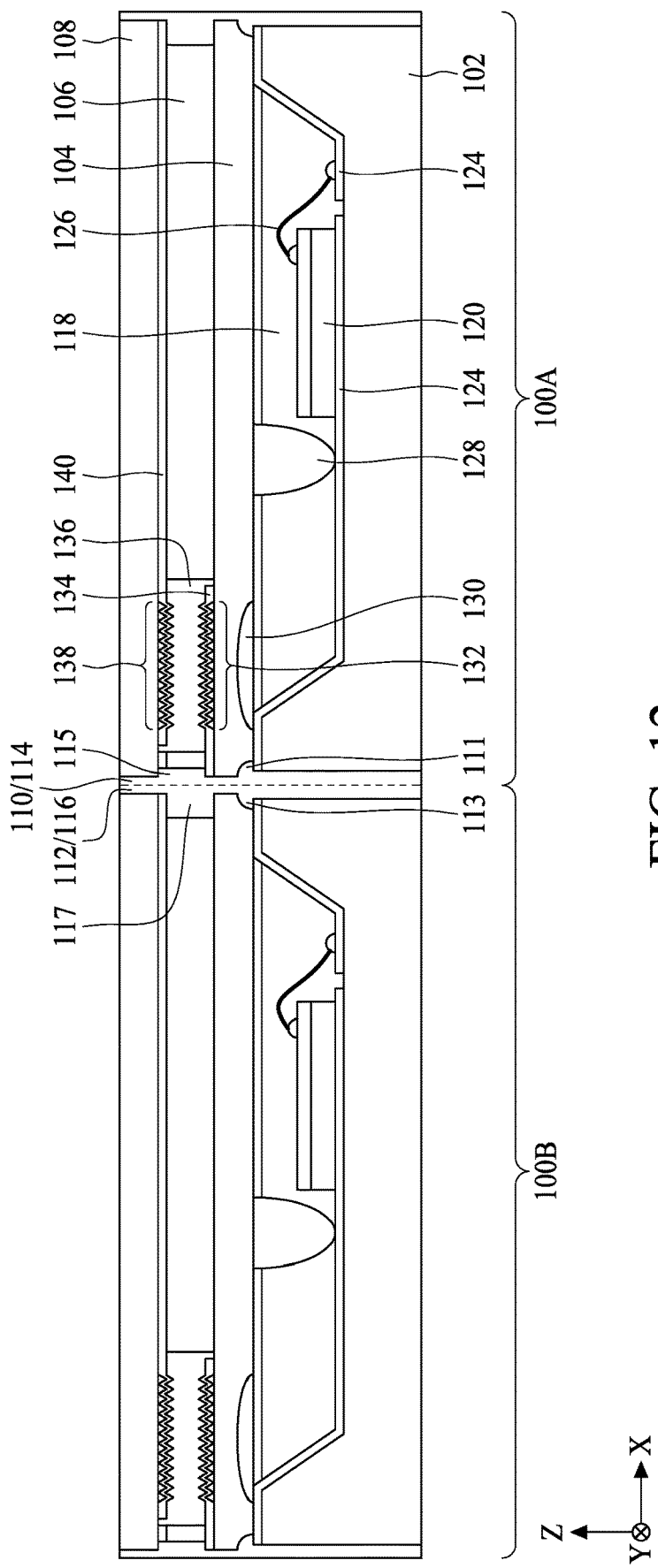

In FIG. 11, a laser drilling process is then used to form through holes 141 passing through the second transparent substrate 108 and the first transparent substrate 104, thereby exposing the through holes 119, the recess structures 131, and the recess structures 137. Suitable conductive material may be dispensed to form a conductive layer at least covering the exposed sidewalls of the through holes 119, the recess structures 131, the recess structures 137 and the through holes 141. For example, by dripping or injecting a droplet of conductive glue, such as silver glue, at top opening of the through holes 141, and a silver layer is formed to substantially cover all the exposed sidewalls of the through holes 119, the recess structures 131, the recess structures 137 and the through holes 141. In some embodiments, the through holes 119, the recess structures 131, the recess structures 137 and the through holes 141 are filled up by the conductive material. As shown in FIG. 12, the first conductive feature 110, the second conductive feature 112, the third conductive feature 114, the fourth conductive feature 116, and the conductor structures 111, 113, 115 and 117 are therefore formed. Then the semiconductor structures 100, for example the semiconductor structures 100A and 100B, are singulated by a cutting tool, such as a die saw, a laser or the like.

Figure 13:
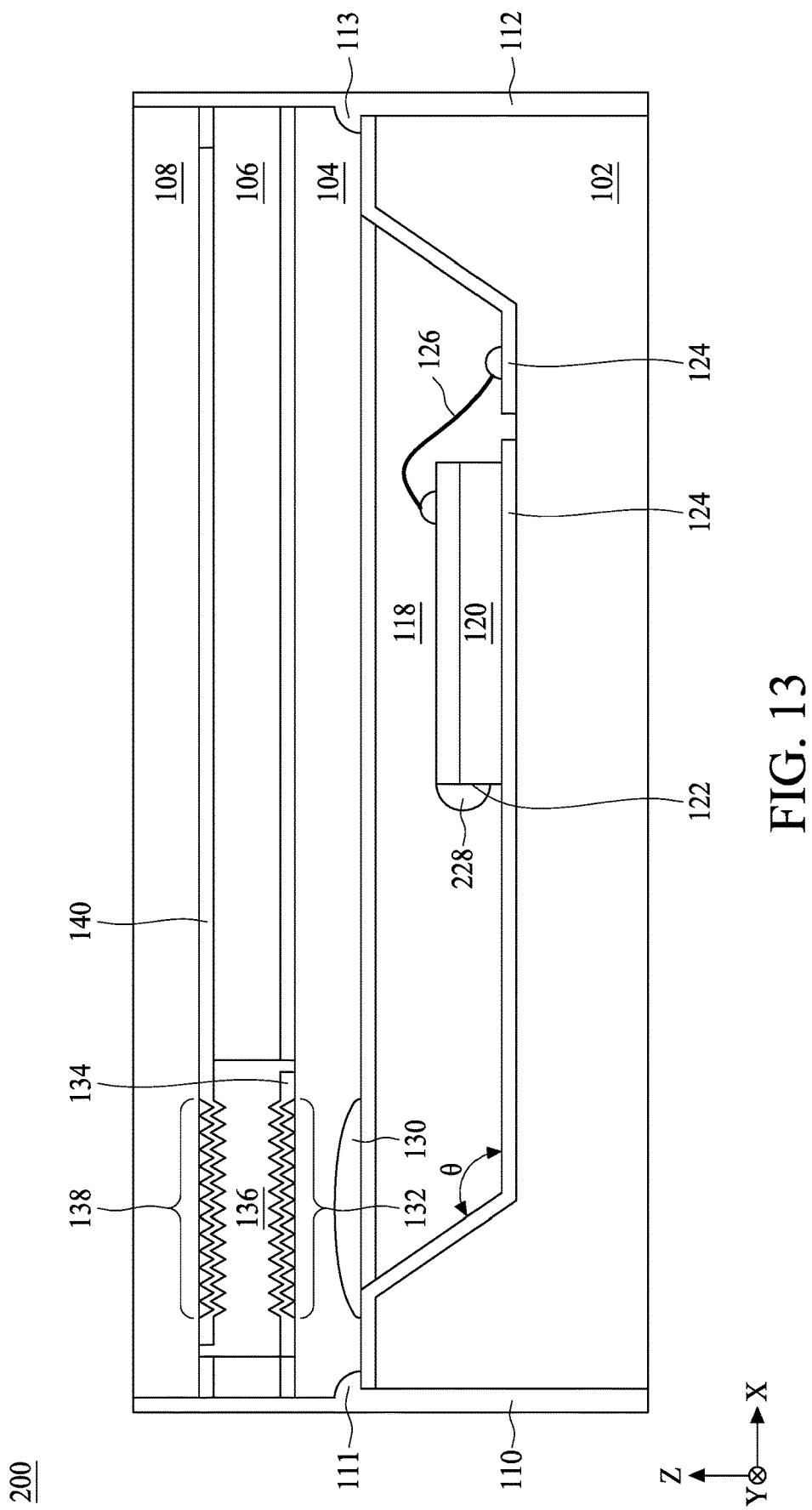
FIG. 13 is a cross-sectional view of a semiconductor structure in accordance with some embodiments of the present disclosure.

FIG. 13 is a cross-sectional view of a semiconductor structure 200 in accordance with some embodiments of the present disclosure. The lens 128 of the semiconductor structure 200 is replaced by a lens 228 embedded on the side 122 of the light source structure 120.

Figure 14:
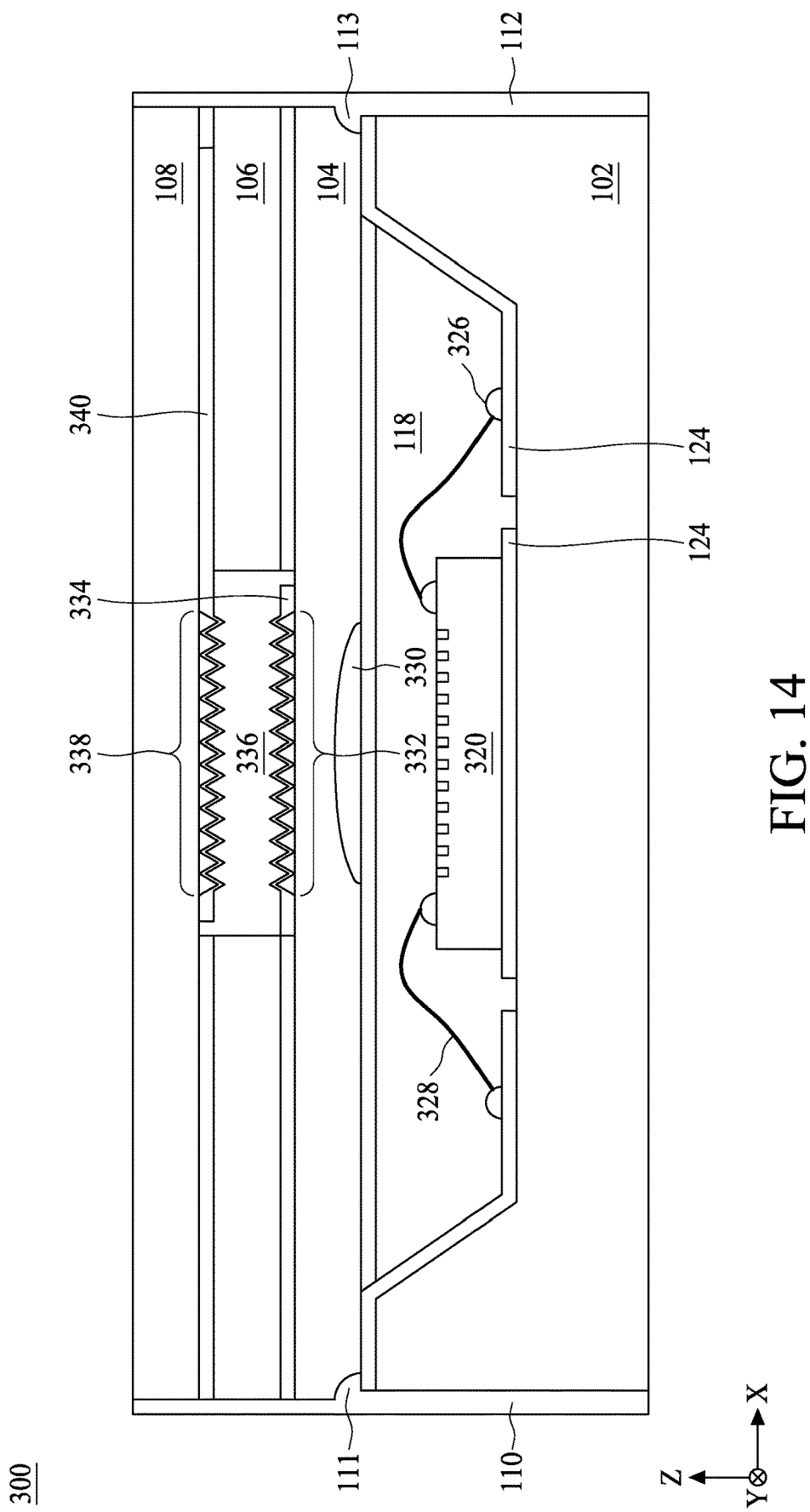
FIG. 14 is a cross-sectional view of a semiconductor structure in accordance with some embodiments of the present disclosure.

FIG. 14 is a cross-sectional view of a semiconductor structure 300 in accordance with some embodiments of the present disclosure. The light source structure 120 emitting a light from the side 122 thereof is replaced by a light source structure 320 emitting a light from a top surface of the light source structure 320. For example, the light source structure 320 may be a VCSEL. In this embodiment, a first power pad and a second power pad are both at the top surface of the light source structure 320. The first power pad and the second power pad may be coupled to the conductive layer 124 through conductors 326 and 328, such as a conductive wire including metal, respectively. Positions of an optical structure 330, a first DOE 332, a first electrical thin film 334, a space 336, a second DOE 338 and a second electrical thin film 340 of the semiconductor structure 300 have an offset compared to the optical structure 130, the first DOE 132, the first electrical thin film 134, the space 136, the second DOE 138 and the second electrical thin film 140 of the semiconductor structure 100 in correspondence with change of the light path. In particular, the optical structure 330, the first DOE 332, the first electrical thin film 334, the space 336, the second DOE 338 and the second electrical thin film 340 are aligned with the light source structure 320.

Figure 15:
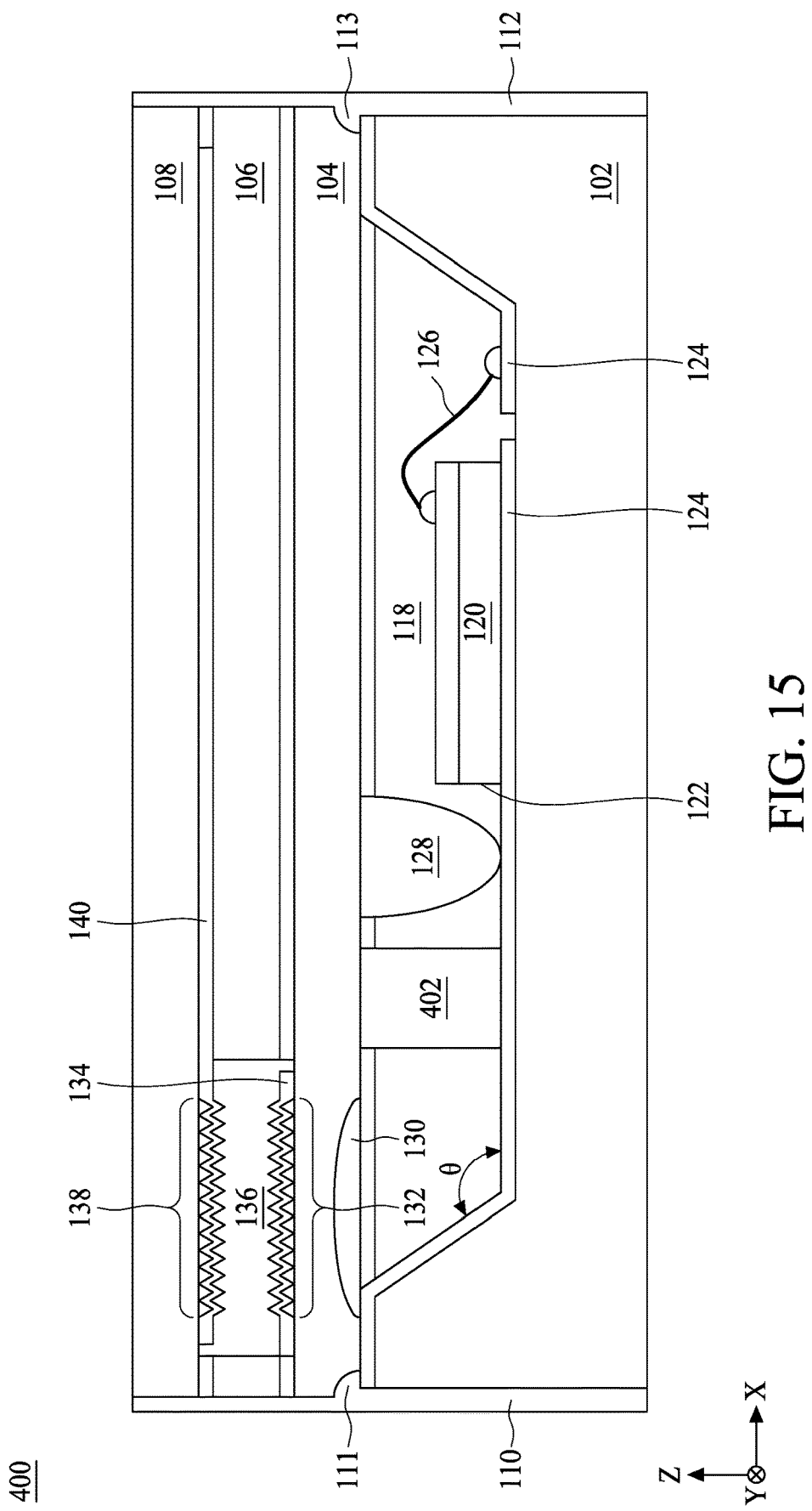
FIG. 15 is a cross-sectional view of a semiconductor structure in accordance with some embodiments of the present disclosure.

FIG. 15 is a cross-sectional view of a semiconductor structure 400 in accordance with some embodiments of the present disclosure. Compared to the semiconductor structure 200, the semiconductor structure 400 further includes a non-linear crystal 402. The light emitted from the light source structure 120 is frequency-doubled through the non-linear crystal 402. For example, the non-linear crystal 402 may include KTP, Lithium Triborate (LBO), or Beta Barium Borate (BBO) to produce a shorter wavelength light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising
    a substrate having a cavity recessed from a top surface of the substrate toward a bottom surface of the substrate opposite to the top surface, wherein the cavity has a sidewall and a bottom surface, and the bottom surface of the cavity is substantially parallel to the top surface of the substrate;
    a light source structure in the cavity, and the light source structure emitting a light from a sidewall of the light source structure; and
    a diffractive optical element (DOE) over the top surface of the substrate;
    wherein the sidewall of the cavity is a sloped surface, so that when the light is incident on the sidewall, the sloped surface reflects the incident light to generate a reflected light toward the DOE.

2. The semiconductor structure of claim 1, wherein the light source structure is an edge emitting laser diode (EELD).

3. The semiconductor structure of claim 1, wherein a top surface of the light source structure is lower than the top surface of the substrate.

4. The semiconductor structure of claim 1, wherein the sidewall of the cavity has a (111) surface orientation.

5. The semiconductor structure of claim 4, wherein the bottom surface of the cavity has a (100) surface orientation.

6. The semiconductor structure of claim 4, wherein the sidewall of the cavity and the bottom surfaces of the cavity form an angle equal to about 54.7 degrees.

7. The semiconductor structure of claim 1, further comprising a lens between the light source structure and the sidewall of the cavity for light expansion.

8. The semiconductor structure of claim 1, further comprising a transparent substrate over the substrate, the transparent substrate having a top surface and a bottom surface, wherein the DOE is at the top surface of the transparent substrate, and the bottom surface of the transparent substrate faces the cavity.

9. The semiconductor structure of claim 8, wherein the bottom surface of the transparent substrate has a concave structure for light expansion.

10. A semiconductor structure, comprising
    a substrate having a cavity recessed from a top surface of the substrate toward a bottom surface of the substrate opposite to the top surface, wherein the cavity has a sidewall and a bottom surface, and the bottom surface of the cavity is substantially parallel to the top surface of the substrate;
    a light source structure in the cavity;
    a first transparent substrate over the top surface of the substrate;
    a conductive layer between the substrate and the first transparent substrate; and
    a first conductive feature passing through the first transparent substrate, the substrate and the conductive layer, and the first conductive feature being coupled to the light source structure through the conductive layer.

11. The semiconductor structure of claim 10, wherein the conductive layer extends along the top surface of the substrate, the sidewall of the cavity and the bottom surface of the cavity.

12. The semiconductor structure of claim 11, wherein the first conductive feature is coupled to a first terminal of the light source structure through the conductive layer.

13. The semiconductor structure of claim 12, further comprising a second conductive feature passing through the first transparent substrate and the substrate, wherein the second conductive feature is coupled to a second terminal of the light source structure through the conductive layer.

14. The semiconductor structure of claim 13, further comprising:
    a first diffractive optical element (DOE) over the first transparent substrate; and
    a first electrical thin film over the first DOE.

15. The semiconductor structure of claim 14, wherein the first electrical thin film includes indium tin oxide (ITO).

16. The semiconductor structure of claim 14, further comprising a third conductive feature passing through the first transparent substrate and the substrate, wherein the third conductive feature is coupled to the first electrical thin film.

17. The semiconductor structure of claim 16, further comprising:
    a second transparent substrate over the first transparent substrate, the second transparent substrate having a top surface and a bottom surface opposite to the top surface of the second transparent substrate, wherein the bottom surface of the second transparent substrate faces the first transparent substrate;
    a second DOE at the bottom surface of the second transparent substrate;
    a second electrical thin film on the second DOE; and
    a spacer between the first transparent substrate and the second transparent substrate.

18. The semiconductor structure of claim 17, further comprising a fourth conductive feature passing through the second transparent substrate, the spacer, the first transparent substrate, and the substrate, wherein the fourth conductive feature is coupled to the second electrical thin film.

19. A method of manufacturing a semiconductor structure, comprising
    providing a substrate having a top surface and a bottom surface opposite to the top surface;
    etching the substrate to obtain a cavity at the top surface of the substrate, wherein the cavity has a sidewall and a bottom surface, and the bottom surface of the cavity is substantially parallel to the top surface of the substrate;
    forming a first through hole passing through the substrate;
    depositing a conductive layer over the top surface of the substrate and the sidewall and the bottom surface of the cavity;
    bonding a light source structure in the cavity, and the light source structure emitting a light from a sidewall of the light source structure; and
    disposing a transparent substrate over the substrate, wherein the transparent substrate includes a diffractive optical element (DOE) on a top surface of the transparent substrate;

forming a second through hole passing through the transparent substrate, wherein the second through hole aligns the first through hole; and injecting conductive material into the second through hole, wherein the conductive material flows into the first through hole from the second through hole.

20. The method of claim 19, wherein the conductive material at least covers sidewalls of the first and second through hole, and the conductive material is coupled to the conductive layer.

* * * * *